United States Patent [19]

Iwahashi et al.

[11] Patent Number: 4,922,133
[45] Date of Patent: May 1, 1990

[54] VOLTAGE DETECTING CIRCUIT

[75] Inventors: Hiroshi Iwahashi, Yokohama; Hiroto Nakai, Kawasaki; Masamichi Asano, Tokyo, all of Japan

[73] Assignee: Kabushiki Kaisha Toshiba, Kawasaki, Japan

[21] Appl. No.: 226,097

[22] Filed: Jul. 29, 1988

[30] Foreign Application Priority Data

Jul. 31, 1987 [JP] Japan .................... 62-191547

[51] Int. Cl.$^5$ .......................................... H03K 5/153
[52] U.S. Cl. ...................... 307/363; 307/362; 307/360; 307/361
[58] Field of Search ............ 307/362, 363, 360, 361, 307/358

[56] References Cited

U.S. PATENT DOCUMENTS

| 4,709,165 | 11/1987 | Higuchi et al. | 307/362 |
| 4,806,788 | 2/1989 | Tobita | 307/362 |
| 4,812,680 | 3/1989 | Kawashima et al. | 307/362 |
| 4,825,018 | 4/1989 | Okada et al. | 307/362 |

OTHER PUBLICATIONS

Japanese Patent Disclosure (Kokai) No. 62-98823; T. Shibata et al., Dated May 8, 1987.

Primary Examiner—Stanley D. Miller
Assistant Examiner—Richard Roseen
Attorney, Agent, or Firm—Finnegan, Henderson, Farabow, Garrett and Dunner

[57] ABSTRACT

A voltage detecting circuit comprising a voltage-input terminal for receiving a first voltage or a second voltage higher than the first voltage, switch means connected between the voltage-input terminal and a first node, and an inverter circuit having an input terminal coupled to the first node and an output terminal coupled to a second node. The switch circuit is turned on when the voltage at the voltage-input terminal is higher than a predetermined value which is between the higher than the first voltage and lower than the second voltage, and is turned off when the voltage at the voltage-input terminal is lower than the predetermined value. The inverter circuit includes a first transistor having a source-drain path coupled between a first power-source potential terminal and the second node, a current control section for maintaining a current flowing through the source-drain path of the first transistor at a predetermined value, and a second transistor having a source-drain path connected between the second node and a second power-source potential terminal and a gate coupled to the first node.

10 Claims, 3 Drawing Sheets

VOLTAGE DETECTING CIRCUIT

BACKGROUND OF THE INVENTION

1. Field of the Invention

The present invention relates to a voltage detecting circuit and, more particularly, to a voltage detecting circuit for detecting the power-source voltage applied to the power-source terminal of a EPROM (Erasable Programmable ROM), in order to determine in which one of its operation modes the EPROM is set.

2. Description of the Related Art

Generally, EPROMs comprise floating gate type MOS transistors used as memory cell. To program the EPROM, that is, to write data into these memory cells, it is necessary to apply a voltage to the cells, which is higher than the voltage which is applied thereto to read data from the memory cells. Hence, two different power-source voltages must be externally applied to the EPROM. The EPROM, therefore, has two power-source terminals. An ordinary power-source voltage of 5 V is applied to the first power-source terminal at all times, and an ordinary power-source voltage of 5 V or a power-source voltage of 12.5 V is applied to the second power-source terminal only when required.

When the power-source voltage of 5 V is applied to the second power-source terminal, the EPROM is set in the data-reading mode. When the power-source voltage of 12.5 V is applied to the second power-source terminal, the EPROM is set in the programming mode. The voltage detecting circuit is incorporated in the EPROM. This circuit detects which power-source voltage, 5 V or 12.5 V, is applied to the second power-source terminal. From the voltage detected by the voltage detecting circuit, it is determined whether the EPROM should be set to the data-reading mode or the programming mode.

This detecting circuit detects whether the voltage applied to the second power-source terminal is higher than a predetermined value which is between 5 V and 12.5 V, or lower.

The conventional voltage detecting circuit includes a voltage-drop circuit and a CMOS inverter. The voltage detecting circuit detects a voltage by using, as a reference, the threshold voltage of the CMOS inverter.

The voltage-drop circuit is designed so as to lower the voltage applied to the second power-source terminal and being somewhere between 5 V and 12.5 V, to a value which is nearly equal to the threshold voltage of the CMOS inverter. More specifically, the voltage at the second power-source terminal of the EPROM is dropped by a predetermined constant value by means of the voltage-drop circuit. The voltage, thus dropped, is applied to the input terminal of the CMOS inverter. This voltage is higher than the threshold voltage of the CMOS inverter when the power-source voltage of 12.5 V is applied to the second power-source terminal of the EPROM, and is lower than the threshold voltage of the CMOS inverter when the power-source voltage of 5 V is applied to the second power-source terminal. Hence, the CMOS inverter generates an output signal at a logic "0" level when the power-source voltage of 12.5 V is applied to the second power-source terminal, and generates an output signal at a logic "1" level when the power-source voltage of 5 V is applied to the second power-source terminal. In accordance with the level of the output signal of the CMOS inverter, it is determined which power-source voltage, 5 V or 12.5 V, is applied to the second power-source terminal.

The detecting voltage of the detecting circuit change in accordance with the threshold voltage of the CMOS inverter.

The threshold voltage of the CMOS inverter changes in accordance with the drive-voltage which is applied to the first power-source terminal to drive the CMOS inverter.

To stabilize the threshold voltage of the CMOS inverter, the power-source voltage of 5 V applied to the first power-source terminal is used to drive the CMOS inverter. However, the voltage applied to the first power-source terminal varies by about 1 V in accordance with the operation mode, the data-reading mode or the programming mode. That is, a data-reading voltage of 6 V, which is one volt higher than the voltage applied to the first power-source terminal at all times must be applied to the first power-source terminal to set the EPROM in so-called "program verifying mode", whereby a reliable test is effect on the memory cells to determine whether or not correct data has been written into the memory cells.

It will now be explained why a reliable test can be effected.

The memory cells of the EPROM are floating-gate type transistors. Electrons are injected into the floating gate of any selected cell (i.e., transistor), thereby writing a data "0" into the cell. Then, the threshold voltage of the cell rises above the voltage applied to the first power-souce terminal. Any memory cell, the floating gate of which has no electrons injected into it, and the threshold voltage of which is lower than the voltage applied to the first power-source terminal, is regarded as storing a data "1". To read data from the memory cells, the voltage applied to the first power-source terminal is applied to the gates of the cells. Those cells storing data "0" are not turned on since their threshold voltage is higher than the power-source voltage. In contrast, those cells storing data "1" are turned on since their threshold voltage is lower than the power-source voltage. Hence, it is determined whether each cell stores a data "0" or a data "1", in accorance with whether the cell is turned on or off when the power-source voltage is applied to the cell.

As has been pointed out, the memory cell (i.e., the transistor) is turned off when its threshold voltage rises above the voltage applied to the first power-source terminal. The more electrons injected into the floating gate of the memory cell, and the higher the threshold voltage of the memory cell, the more reliable is the memory cell.

Therefore, in oder to make each memory cell sufficiently reliable, that is, in order to raise the threshold voltage of the cell, a voltage is applied to the first power-source terminal when the EPROM is set in the program verifying mode, which voltage is higher than when the EPROM is set in the data read mode. When the EPROM is set in the program verifying mode, the voltage applied to the first power-source terminal should better be as high as possible.

When the program-verifying voltage of 6 V is applied to the first power-source terminal, the threshold voltage of the CMOS inverter, which is driven by the voltage of 6 V, becomes higher than when the voltage of 5 V is applied to the first power-source terminal.

Since the threshold voltage of the CMOS inverter is higher when the EPROM is set in the programming mode than when the EPROM is set in the data read mode, the reference level for determining the output voltage of the voltage detecting circuit is also higher when the EPROM is set in the programming mode than when the EPROM is set in the data read mode.

When the EPROM is set in the data read mode, it is desirable that the reference voltage be high for the following reason. In the data read mode, the same voltage as is applied to the first power-source terminal i.e., 5 V, is applied also to the second power-source terminal. Noise may be generated in the second power-source terminal. If this is the case, the voltage at the second power-source terminal will rise above 5 V. If the reference level is lower than this risen voltage, the voltage detecting circuit will detect the noise, and the EPROM will be automatically set into the programming mode erroneously.

On the other hand, when the EPROM is set in the programming mode, it is desirable that the reference voltage be low to have a broad noise margin, for the following reason. If the threshold voltage of the transistor of the voltage detecting circuit is higher than the design value due to process errors, the reference voltage must be higher than the voltage applied to the second power-source terminal. In this case, the voltage detecting circuit may fail to detect that the voltage applied to the second power-source terminal has risen above 12.5 V. Further, when noise is generated in the second power-source terminal during the programming, whereby the voltage at this terminal falls below the reference voltage, then the voltage detetecting circuit will detects this voltage drop, thereby erronesouly setting the EPROM into the data read mode.

Nonetheless, as has been pointed out, the reference voltage used in the conventional voltage detecting circuit is lower when the EPROM is set in the data read mode than when the EPROM is set in the programming mode.

If the reference voltage is set at a high value, it will have a noise margin broad enough for achieving correct reading of data. The voltage applied to the first power-source terminal is higher when the EPROM is set in the progrmming mode than when the EPROM is set in the data read mode. Therefore, the reference voltage must be even higher when the EPROM is set in the programming mode, and must have a narrower noise margin. Obviously, it is impossible with the conventional voltage detecting circuit to broaden both the noise margin for the data-reading operation and the noise margin for the programming operation.

Therefore, the conventional voltage detecting circuit can hardly determine correctly whether the power-source voltage applied to the second power-source terminal is 5 V or 12.5 V.

SUMMARY OF THE INVENTION

The object of the present invention is to provide a voltage detecting circuit which can detect a voltage correctly, despite the variation of the power-source voltage applied to it.

According the present invention, there is provided a voltage detecting circuit which comprises: a voltage-input terminal for receiving a first voltage or a second voltage higher than the first voltage; first and second nodes; a switch circuit connected between the voltage-input terminal and the first node, said switch circuit being turned on when the voltage at the voltage-input terminal is higher than a predetermined value which is between the higher than the first voltage and lower than the second voltage, and being turned off when the voltage at the voltage-input terminal is lower than the predetermined value; a first power-source potential terminal; a second power-source potential terminal; and an inverter circuit having an input node coupled to the first node and an output node coupled to the second node, and including a first transistor having a source-drain path coupled between the first power-source potential terminal and the second node, a current control section for maintaining a current flowing through the source-drain path of the first transistor at a predetermined value, and a second transistor having a source-drain path connected between the second node and the second power-source potential terminal and a gate coupled to the first node.

Since the current control section maintains the current flowing through the source-drain path of the first transistor at a predetermined value, it is only the threshold voltage of the second transistor which determines the threshold voltage of the inverter circuit. The threshold voltage of the inverter circuit remains unchanged even if the potential of the first power-soruce potential terminal changes. Hence, the voltage detecting circuit according to the present invention can perform an accurate detection of a voltage, despite the variation of the first power-source potential.

DETAILED DESCRIPTION OF THE PREFERRED EMBODIMENTS

Figure 1:
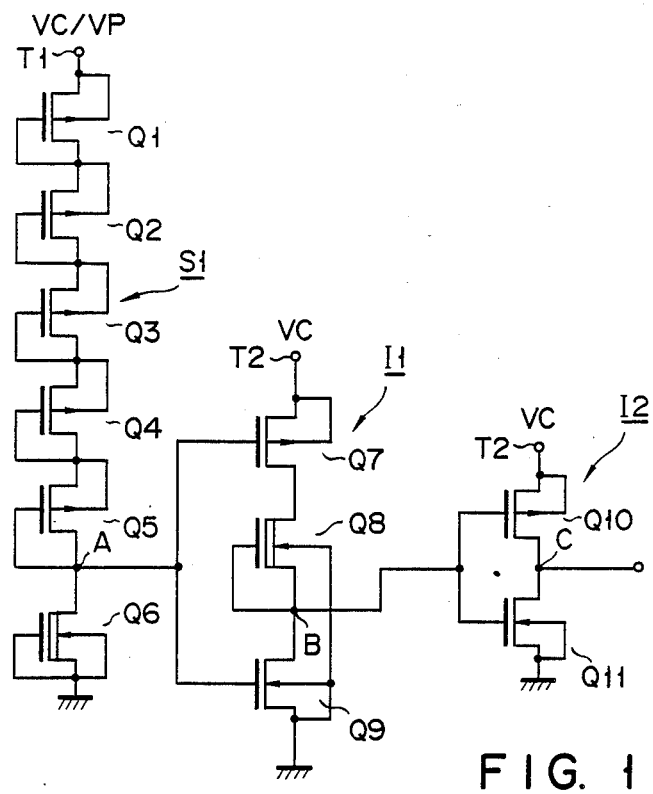
FIG. 1 is a circuit diagram showing a voltage detecting circuit according to a first embodiment of this invention.

FIG. 1 shows a voltage detecting circuit according to a first embodiment of the present invention. This circuit is formed on a semiconductor chip, in which an EPROM is integrated. The voltage detecting cirucit is so configurated as to outputs a signal at either a logic "0" level or a logic "1" level, in accordance with the power-source voltage externally applied to the first power-source terminal T1 of the EPROM.

Power-source voltage VC of 5 V or second power-source voltage VP of 12.5 V is externally applied to power-source terminal T1. A switch circuit S1 comprises enhancement-type P-channel MOS transistors Q1 to Q5 is connected between power-source terminal T1 and node A. The source-drain path of these transistors Q1 to Q5 are connected in series between terminal T1 and node A. The gate and the drain of each MOS transistor are coupled to each other. The source-drain path of depletion-type N-channel MOS transistor Q6 is connected between node A and the ground. The gate and the source of this transistor Q6 are coupled to each other. Therefore, transistor Q6 is kept conductive at all times, and functions as a load circuit for discharging node A.

Switch circuit S1 is turned on when the voltage of first power-source terminal T1 is higher than the sum of the threshold voltages $V_{TP}$ of transistors Q1 to Q5, i.e., 5 $V_{TP}$, and is turned off when when the voltage of terminal T1 is equal to, or lower than, 5 $V_{TP}$. Thus, assuming that the threshold voltage of transistors Q1 to Q5 is 1.2 V, switch circuit S1 is turned on when the voltage of terminal T1 is higher than 6 V, and is turned off when the voltage of terminal T1 is equal to or lower than 6 V. Therefore, when power-source voltage VC (5 V) is applied to terminal T1, switch circuit S1 is turned off, and transistor Q6 discharges node A, setting the potential of node A at almost 0 V. When power-source voltage VP (12.5 V) is applied to terminal T1, the voltage of terminal T1 rises from 5 V to 12.5 V. Switch circuit S1 is turned on when the voltage at power-source terminal T1 exceeds 6 V. Once switch circuit S1 has been turned on, the potential at node A is determined by the ratio of the total conductance of transistors Q1 to Q5 which constitute switch circuit S1 to the conductance of transistor Q6, and also by the voltage at power-source terminal T1. The conductance ratio is of such a value that the potential at node A rises above the threshold voltage of inverter circuit I1 when the voltage at power-source terminal T1 increases to 12.5 V.

Inverter circuit I1 is driven by power-source voltage VC applied to second power-source terminal T2 of the EPROM. Circuit I1 comprises enhancement-type P-channel MOS transistor Q7, depletion-type N-channel MOS transistor Q8, and enhancement-type N-channel MOS transistor Q9. The source-drain paths of transistors Q7 and Q8 are connected in series between the terminal T2 and the output node B of inverter circuit I1. The gate of transistor Q7 is coupled to node A. The gate and the source of transistor Q8 are coupled to each other. The source-drain path of transistor Q9 is connected between node B and the ground. The gate of transistor Q9 is connected to node A.

As has been pointed out, power-source voltage VC is 5 V when the EPROM is set in the data-reading mode, but is 6 V when the EPROM is set in the programming mode. Nonetheless, the current flowing from terminal T2 to node B through the source-drain paths of transistor Q7 and Q8 remains substantially unchanged. This is because depletion-type N-channel MOS transistor Q8 has constant-current characteristic. Hence, the threshold voltage of circuit I1 is determined by the threshold voltage of transistor Q9, and is thus constant, regardless of the variation of the potential of second power-source terminal T2.

In the inverter circuit I1, when the potential of node A is higher than the threshold voltage of inverter circuit I1, transistor Q9 is turned on, thus setting node B at 0 V, i.e., logic "0" level. Conversely, when the potential of node A is equal to, or lower than, the threshold voltage of inverter circuit I1, transistor Q9 is turned off, thereby setting node B at a voltage substantially equal to power-source voltage VC, i.e., logic "1" level.

Node B is connected to the input of inverter circuit I2 which is driven by the power-source voltage VC. This inverter circuit I2, which is a CMOS inverter, comprises enhancement-type P-channel MOS transistor Q10 and enhancement-type N-channel MOS transistor Q11. The source-drain paths of MOS transistors Q10 and Q11 are connected in series between second power-source terminal T2 and the ground. The gates of both transistors Q10 and Q11 are coupled to node B. The node of transistors Q10 and Q11, i.e., node C, is used as the output terminal of inverter circuit I2.

The threshold voltage of inverter circuit I2 changes with the power-source voltage applied to second power-source terminal T2. Nonetheless, the changes of the threshold voltage of inverter circuit I2 does not influence the operation of the voltage detecting circuit. This is because, the voltage applied to the gates of transistors Q10 and Q11 is 0 V or substantially equal to power-source voltage VC, in accordance with the power-source voltage applied to the first power-source terminal T1.

Therefore, voltage detecting circuit shown in FIG. 1 can correctly detect the voltage applied to the first power-supply terminal T1, notwithstanding the variation of the power-source voltage VC applied to second power-supply terminal T2. Furthermore, in this voltage detecting circuit, the value which the voltage at power-source terminal T1 has when the potential at node A increases to the threshold voltage of inverter circuit I1 can be set at a desired value, by adjusting the ratio of the total conductance of transistors Q1 and Q5 to the conductance of transistor Q6, or by changing the number of P-channel MOS transistors incorporated in switch circuit S1.

Figure 2:
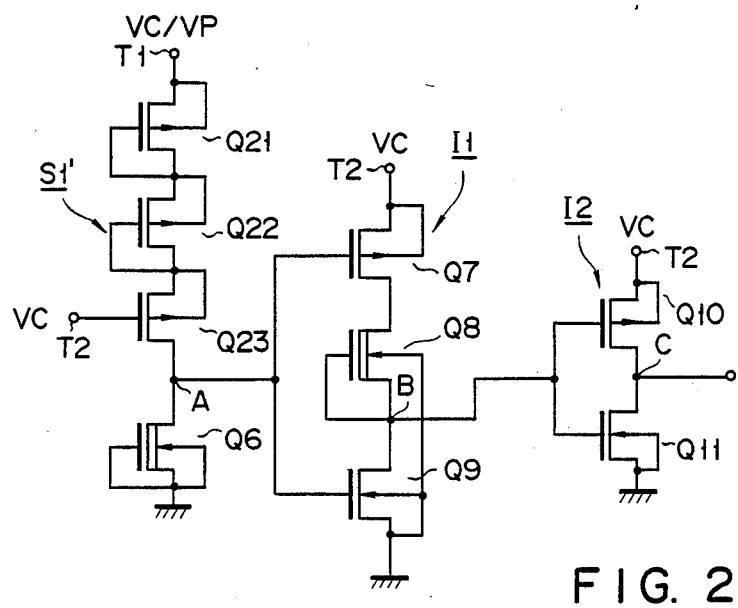
FIG. 2 is a circuit diagram illustrating a voltage detecting circuit according to a second embodiment of the present invention.

FIG. 2 illustrates a voltage detecting circuit according to a second embodiment of the present invention. This voltage detecting circuit is different from the circuit shown in FIG. 1, only in that switch circuit S1' is used in place of switch S1 shown in FIG. 1. Due to the use of switch circuit S1', the circuit shown comprises less components than the voltage detecting circuit illustrated in FIG. 1.

As is shown in FIG. 2, switch circuit S1', includes enhancement-type P-channel MOS transistors Q21, Q22, and Q23, and depletion-type N-channel MOS transistor Q6. The source-drain paths of transistors Q21, Q22, and Q23 are connected in series between first power-source terminal T1 and node A. The gate and drain of transistor Q21 are connected to each other. Also, the gate and drain of transistor Q22 are connected to each other. The gate of transistor Q23 is coupled to second power-source terminal T2.

Having the structure described above, switch circuit S1' is turned on when the voltage of terminal T1 becomes higher than the sum, i.e., 3 $V_{TP}$+VC, of the total threshold voltage (=3 $V_{TP}$) of transistors Q21 to Q23 and the power-source voltage VC, and is turned off when the voltage of the first power-source terminal T1 is equal, to or lower than, 3 $V_{TP}$+VC. Assuming that the threshold voltage $V_{PT}$ of transistors Q21 to Q23 is 1.2 V, whereas power-source voltage VC is 5 V, then switch circuit S1' is turned on when the voltage of terminal T1 is higher than 8.6 V, and is turned off when the voltage of terminal T1 is equal to, or lower than, 8.6 V. Hence, when power-source voltage VC, 5 V, is applied to terminal T1, switch circuit S1' is turned off, whereby transistor Q6 discharges node A, thereby setting the potential of node A at almost 0 V. On the other hand, when the power-source voltage is switched from VC to VP, 12.5 V, the voltage of the first power-source terminal T1 rises from 5 V to 12.5 V. The moment this voltages rises above 8.6 V, switch circuit S1' is turned on. While switch circuit S1' is on, the potential of node A is determined by the voltage of the first power-source terminal T1 and the ratio of the total conductance of transistors Q21 to Q23 to the conductance of transistor Q6.

As has been described, switch circuit S1 shown in FIG. 1 is turned on when the voltage of terminal T1 rises above 6 V. At the time, the potential of node A remains almost unchanged and is almost 0 V due to the voltage drop which has been caused by transistors Q1 to Q5. In contrast, switch circuit S1' is turned on when the voltage of terminal T1 rises above 8.6 V. That is, when switch circuit S1' is turned on, the voltage at power-source terminal T1 has a greater value than when switch circuit S1 is turned on. When switch circuit S1' is turned on, the voltage at node A is lower than the voltage at power-source terminal T1 by the total threshold voltage of transistors Q21 and Q22, i.e., about 2.4 V. Obviously the voltage at node A is higher than 0 V. In other words, although switch circuit S1' requires a higher voltage than switch circuit S1, to be turned on, the potential at which node A is set when switch S1' is turned on is higher than that at which node A is set when switch S1' is turned on. Hence, the value which the voltage at power-source terminal T1 has when the potential at node A increases over the threshold voltage of inverter circuit I1 can be almost the same as in switch circuit S1 shown in FIG. 1, by adjusting the ratio of the total conductance of transistors Q21 to Q23 to the conductance of transistor Q6, or by adjusting the number of P-channel MOS transistors incorporated in switch circuit S1'.

Figure 3:
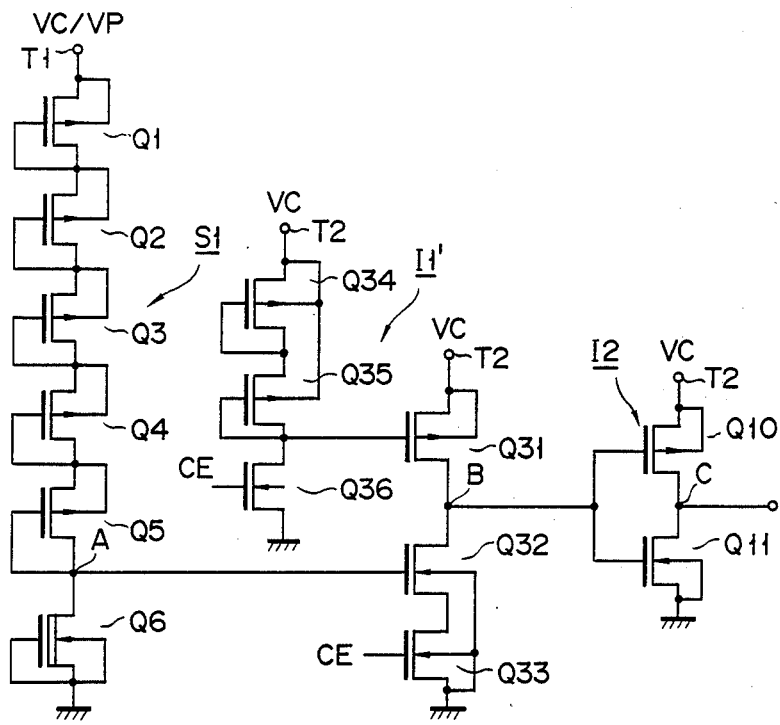
FIG. 3 is a circuit diagram showing a voltage detecting circuit according to a third embodiment of this invention.

FIG. 3 shows a voltage detecting circuit according to a third embodiment of this invention. This detecting circuit is different from the voltage detecting circuit shown in FIG. 1, in that inverter circuit I1' is used in place of inverter circuit I1. Inverter circuit I1' comprises enhancement-type P-channel MOS transistors Q31, Q34, and Q35, and enhancement-type N-channel MOS transistors Q32, Q33, and Q36. The source-drain paths of transistors Q34, Q35, and Q36 are connected in series between second power-source terminal T2 and the ground. The gate and drain of transistor Q34 is coupled to each other. The gate and drain of transistor Q35 are connected to each other. A chip enable signal CE is supplied to the gate of transistor Q36. The chip enable signal CE is used to render the EPROM, in which the voltage detecting circuit is incorporated, either active or inactive. When the EPROM is active, transistor Q36 is on.

The source-drain paths of transistors Q31, Q32, and Q33 are connected between second power-source terminal T2 and the ground. The gate of transistor Q31 is connected to the node of transistors Q35 and Q36. The gate of transistor Q32 is coupled to node A. Chip enable signal CE is supplied to the gate of transistor Q33. Hence, transistor Q33 is on all the time the EPROM is active.

Transistors Q34 and Q35 drop the power-source voltage VC applied to terminal T2 by the sum of the threshold voltages of these transistors Q34 and Q35, i.e., 2 $V_{PT}$. The dropped voltage is applied to the gate of transistor Q31. The voltage applied between the gate and source of transistor Q31, therefore, remains unchanged even if the power-supply voltage VC changes. The current flowing between second power-source terminal T2 and node B via the source-drain path of transistor Q31 is substantially constant. Hence, the threshold voltage of inverter circuit I1' is determined by the threshold voltage of transistor Q32, regardless of the variation of the potential of second power-source terminal T2. Therefore, the voltage detecting circuit shown in FIG. 3 can correctly detect the voltage applied to the first power-supply terminal T1, notwithstanding the changes of the power-source voltage VC applied to second power-supply terminal T2.

Transistors Q33 and Q36, to which chip enable signal CE is supplied, are used to minimize the power consumption of inverter circuit I1'. They can be replaced by a load circuit composed of a transistor whose gate and drain are connected to each other.

Figure 4:
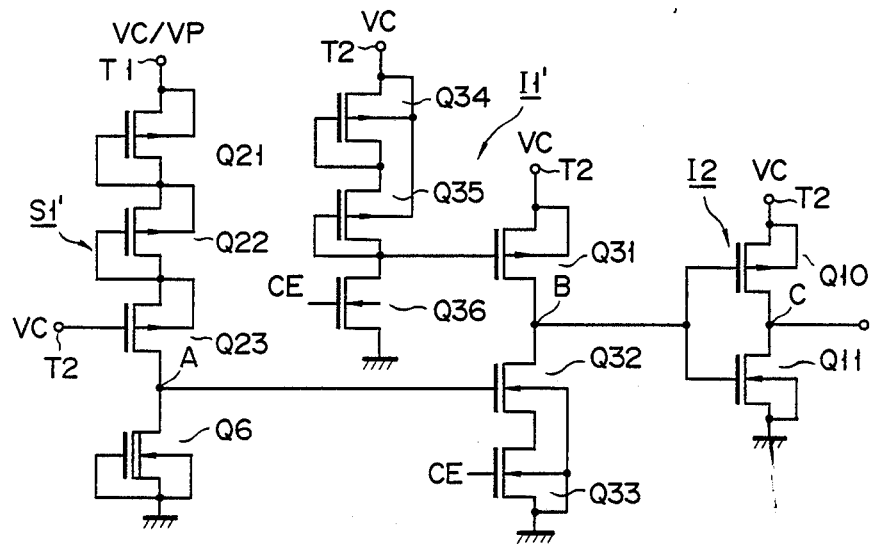
FIG. 4 is a circuit diagram representing a voltage detecting circuit according to a fourth embodiment of the present invention.

FIG. 4 illustrates a voltage detecting circuit according to a fourth embodiment of this invention. This circuit is different from the voltage detecting circuit shown in FIG. 1, in that switch circuit S1' (FIG. 2) and inverter circuit I1' (FIG. 3) are used in place of switch circuit S1 and inverter circuit I1 (both shown in FIG. 1), respectively. Also, this voltage detecting circuit can correctly detect the voltage applied to the first power-supply terminal T1, in spite of the changes of the power-source voltage VC applied to second power-supply terminal T2.

Figure 5:
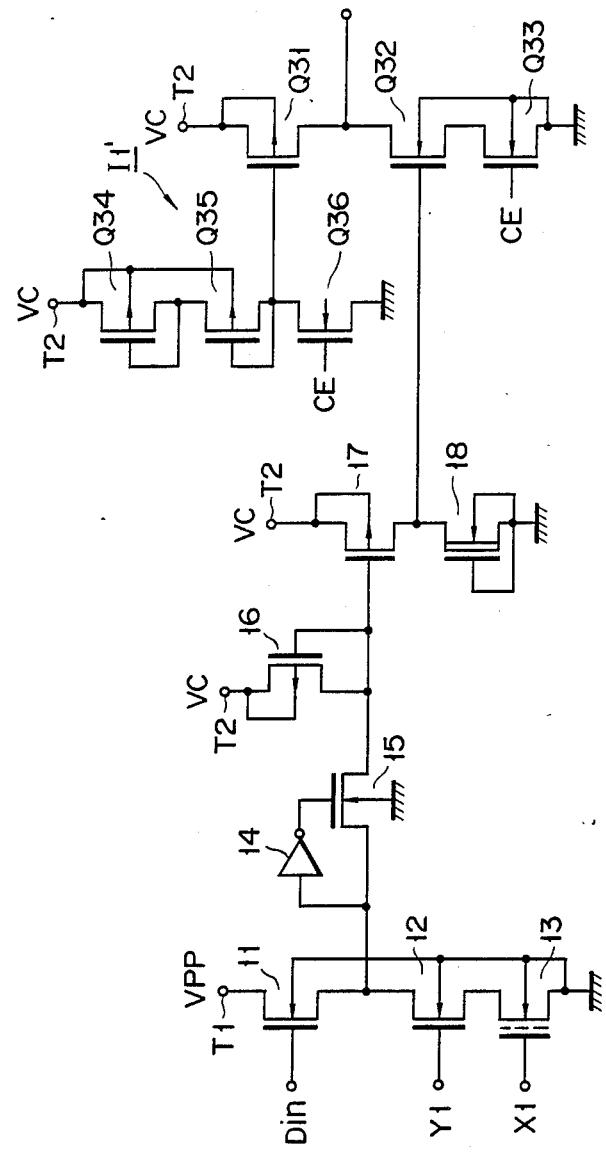
FIG. 5 is a circuit diagram illustrating a data detecting circuit which includes the inverter circuit incorporated in either the circuit shown in FIG. 3 or the circuit illustrated in FIG. 4.

FIG. 5 shows a data detecting circuit of an EPROM, which includes the inverter circuit incorporated in either the circuit shown in FIG. 3 or the circuit illustrated in FIG. 4. Switching signal Din is supplied to the gate of enhancement-type N-channel MOS transistor 11, for determining the data which is to be written into floating gate-type MOS transistor 13 (or a memory cell) when the EPROM is set in the programming mode. The signal X1 output by the row decoder of the EPROM is supplied to the control gate of transistor 13. The signal Y1 output by the column decoder of the EPROM is supplied to the gate of enhancement-type N-channel MOS transistor 12 used for selecting one of the columns of memory cells.

If no electrons have been injected into the floating-gate of transistor 13, transistors 12 and 13 are conductive when signals X1 and Y1 are at logic "1" level while the EPROM is set in the data-reading mode. Due to the discharging of transistors 12 and 13, the input node of inverter 14 falls to logic "0" level. As a result of this, inverter 14 outputs a signal at the logic "1" level. This signal turns on enhancement-type N-channel MOS transistor 15 whose gate is connected to the output of inverter 14. When transistor 15 is conductive, the gate potential of enhancement-type P-channel MOS transistor 17 is discharged by transistors 15, 12, and 13, and this transistor 17 is turned on. Hence, the inverter circuit, which comprised of transistor 17 and depletion-type N-channel MOS transistor 18, outputs a signal at the logic "1" level, whereas the signal output by inverter circuit I1' is at the logic "0" level.

Conversely, if electrons have been injected into the floating-gate of transistor Q13, transistor Q13 remains off even if signal X1 rises to the logic "1" level. Hence, the input node of inverter 14 remains at the logic "1" level. The signal output by inverter 14 is therefore at the logic "0" level, and transistor 15 is turned off. As long as transistor 15 is off, the gate potential of transistor 17 is charged by P-channel enhancement-type MOS transistor 16, and transistor 17 is therefore substantially turned off. As a result, the inverter circuit comprised of transistor 17 and depletion-type N-channel MOS transistor 18 outputs a signal at the logic "0" level, whereas the signal output by inverter circuit I1' is at the logic "1" level.

The data detecting circuit can operate when the EPROM is set in the data-reading mode and the program-verifying mode. As has been described, the power-source voltage VC applied to second power-supply terminal T2 is higher when the EPROM is set in the program-verifying mode than when the EPROM is set in the data-reading mode. Nonetheless, since the threshold voltage of inverter I1' remains unchanged even if the power-source voltage VC changes, the data detecting circuit can perform its function under the same conditions, no matter in which operation mode the EPROM has set, the data-reading mode or the program-verifying mode.

Inverter I1' incorporated in the data detecting circuit can be replaced by inverter I1, which has been explained with reference to FIG. 1 or 2. Also in this case, the same advantages result in, as in the voltage detecting circuits shown in FIG. 1 or FIG. 2.

The present invention is not limited to the embodiments described above. Rather, as will be understood from the above, changes can be made without departing from the technical scope of the present invention.

What is claimed is:

1. A voltage detecting circuit which comprises:
   a voltage-input terminal;
   first and second nodes;
   switch means connected between the voltage-input terminal and the first node, the switch means being turned on when a potential at the voltage-input terminal is higher than a predetermined value which is between a first voltage and a second voltage which is higher than the first voltage, and being turned off when the potential at the voltage-input terminal is lower than the predetermined value;
   a first power-source potential terminal;
   a second power-source potential terminal;
   an inverter circuit having an input terminal connected to the first node and an output terminal connected to the second node, and including a first transistor having a source-drain path connected between the first power-source potential terminal and the second node, and a second transistor having a source-drain path connected between the second node and the second power-source potential terminal and a gate connected to the first node; and
   current control means for causing the current flowing through the source-drain path of the first transistor to be substantially controlled, whereby to maintain the threshold voltage of the inverter circuit substantially constant irrespective of a potential at the first power-source potential terminal, said current control means including a current-source, the current control means and the first transistor being connected in series between the first power-source potential terminal and the second node.

2. The voltage detecting circuit according to claim 1, further comprising a load circuit connected between said first node and said second power-source potential terminal.

3. The voltage detecting circuit according to claim 1, wherein said current control means includes a third transistor which is a depletion-type having a source-drain path, a gate, and a source; a source-drain path of said third transistor and the source-drain path of said first transistor are connected in series between said first power-source potential terminal and said second node; the gate and source of said third transistor are coupled to each other; and a gate of said first transistor is coupled to said first node.

4. The voltage detecting circuit according to claim 1, wherein said switch means includes an enhancement-type transistor having a gate and a drain which are connected to each other.

5. The voltage detecting circuit according to claim 1, wherein said switch means includes a fourth transistor which is an enhancement-type transistor of a first conductivity type having a source-drain path connected between said voltage-input terminal and said first node, and a gate connected to said first power-source potential terminal.

6. The voltage detecting circuit according to claim 5, wherein said switch means further includes a fifth transistor which is an enhancement-type transistor having a gate and a drain which are connected to each other, and a source-drain path, the source-drain path of said fourth transistor and the source-drain path of said fifth transistor are connected in series between said voltage-input terminal and said first node.

7. A voltage detecting circuit which comprises:
   a voltage-input terminal;
   first and second nodes;
   switch means connected between the voltage-input terminal and the first node, the switch means being turned on when a potential at the voltage-input terminal is higher than a predetermined value which is between a first voltage and a second voltage which is higher than the first voltage, and being turned off when the potential at the voltage-input terminal is lower than the predetermined value;
   a first power-source potential terminal;
   a second power-source potential terminal;
   a first transistor having a source connected to the first power-source potential terminal, a drain connected to the second node, and a gate;
   a second transistor having a drain connected to the second node, a source connected to the second power-source potential terminal, and a gate connected to the first node; and
   a current control circuit having an output terminal connected to the gate of the first transistor, for causing the current flowing through the source-drain path of said first transistor to be substantially controlled irrespective of a potential at the first power-source potential terminal, the current control circuit including level-shifting means connected between the first power-source potential terminal and the output terminal of the current control circuit, for setting the potential at the output terminal at a value less than a potential at said first power-source potential terminal by a predetermined value.

8. The voltage detecting circuit according to claim 7, wherein said level shifting means includes an enhancement-type transistor having a gate and a drain which are coupled to each other.

9. The voltage detecting circuit according to claim 7, which is formed on a chip on which an EPROM is formed, and wherein said first voltage is externally applied to said voltage-input terminal when the EPROM is set in a data-reading mode, and said second voltage is externally applied to said voltage-input terminal when the EPROM is set in a programming mode.

10. The voltage detecting circuit according to claim 9, wherein a power-source potential voltage is externally applied to said first power-source potential terminal when the EPROM is set in the data-reading mode, and a different power-source voltage is externally applied to said first power-source terminal when the EPROM is set in the programming mode.

* * * * *